US006104274A

United States Patent [19]

Matsuda et al.

[11] Patent Number: 6,104,274

[45] Date of Patent: *Aug. 15, 2000

[54] COMPOSITE PTC MATERIAL

[75] Inventors: Kazuyuki Matsuda, Nagoya; Junko Shibata, Kasugai; Kiyoshi Araki, Nagoya, all of Japan

[73] Assignee: NGK Insulators, Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/035,074

[22] Filed: Mar. 5, 1998

[30] Foreign Application Priority Data

Mar. 13, 1997 [JP] Japan .................................... 9-058828
Mar. 3, 1998 [JP] Japan .................................... 10-050293

[51] Int. Cl.[7] .................................... H01L 7/10

[52] U.S. Cl. .................................... 338/22 R; 338/225 D; 338/25

[58] Field of Search .................................... 338/22 R, 225 D, 338/25; 252/521.3

[56] References Cited

U.S. PATENT DOCUMENTS 5,378,407 1/1995 Chandler et al. .................................... 252/513

OTHER PUBLICATIONS

"Positive–Temperature–Coefficient Effect in Conductive–Ceramic/High–Expensive–Ceramic Composites", T. Ota et al.; Journal of Materials Science Letters; Feb. 1, 1987, Chapman & Hall, UK, vol. 16, Nr. 3, pp. 239–240; ISSN 0261–8028 XP002069076.

"Preparation of Graphite/Critstobalite/Silicone Rubber PTC Composites", T. Harada et al,; Dec. 1996, Journal of the Ceramic Society of Japan; International Edition, vol. 104, Nr. 12, pp. 1144–1147, XP000656945.

"Positive Temperature Coefficient of Resistance Effect in Hot–pressed Cristobalite–Silicon Carbide Composites"; Du Wei–Fang et al.; Journal of Materials Science; Feb. 15, 1994, UK, vol. 29, Nr. 4, pp. 1097–1100, ISSN 0022–2461, XP002069077.

"PTC Effect of a Composite of Conductive Ceramic—Ceramic Having High Thermal Expansion"; Ultramodern Technology Highlight; May 1, 1993; vol. 116.

"PTC Effect of Composite of Conductive Ceramic—Ceramic Having High Thermal Expansion"; Annual Report by Ceramic Research Institutions (1991); vol. 1, 57–60.

"Composition PTC Materials"; Annual Report by Ceramic Research Institutions (1995); vol. 5, 13–19.

"PTC Effect and Its Mechanism in a Novel Thermistor Material—Hot–Pressed SiC/$SiC_2$ Multiphase Ceramic"; Institute of Materials Science and Application Chemistry, Hunan University; Nov. 4, 1993.

"Positive–Temperature–Coefficient Effect in Graphite–Cristobalite Composites", Ceramics Research Laboratory, Nagoya Institute of Technology; Junichi Takahasi; Jul. 1992.

"Positive Temperature Coefficient of Resistance Effect in Hot–Pressed Cristobalite–Silicon Carbide Composites"; Du Wei–Fang et al.; Institute of Materials Science and Application Chemistry, University of Hunan; 1994.

*Primary Examiner*—Michael L. Gellner
*Assistant Examiner*—Richard K. Lee
*Attorney, Agent, or Firm*—Parkhurst & Wendel, L.L.P

[57] ABSTRACT

A composite PTC material made of cristobalite as a matrix and a conductive filler, having a room temperature resistivity of $10^{-1}$ Ωcm or less. The conductive filler is at least one substance selected from the group consisting of single metals, metal silicides, metal carbides and metal borides; has a room temperature resistivity of $10^{-3}$ Ωcm or less when per se made into a sintered material; has particle diameters of 2–50 μm; and is contained in a proportion of 20–35% by volume of the composite PTC material. The composite PTC material has a relative density of 90% or more after firing.

6 Claims, 2 Drawing Sheets

TEMPERATURE DEPENDENCY OF RESISTIVITY OF EXAMPLE 2 MATERIAL

Flow chart PTC material production

COMPOSITE PTC MATERIAL

BACKGROUND OF THE INVENTION (1) Field of the Invention

The present invention relates to a composite PTC material favorably used in, for example, a current-limiting element which controls fault current. ("PTC" is an abbreviation of "positive temperature coefficient of resistance".)

(2) Description of Related Art

PTC materials have a property of increasing the electrical resistance sharply with an increase in temperature in a particular temperature range. Therefore, they are used, for example, as a current-limiting element which controls fault current in a breaker.

The best known PTC material is a barium titanate type ceramic whose electrical properties change at the Curie point. With this PTC material, however, the power loss is large because of its high room temperature resistivity and, moreover, the production cost is high. Hence, other substances having PTC property were looked for.

As a result, it was found that composite materials made of a polymer (a matrix) and a conductive substance (a filler) have the same PTC property as possessed by the barium titanate type ceramic.

For example, a mixture consisting of particular proportions of a crystalline polymer (e.g. a polyethylene) as an insulator and conductive particles (e.g. carbon particles) has conductive paths formed in the polymer matrix, is very low in electrical resistance, and acts as a conductor as a result of insulator-conductor transition.

In such a composite material consisting of particular proportions of a crystalline polymer and conductive particles, since the polymer has a thermal expansion coefficient far larger than that of the conductive particles, the crystalline polymer gives rise to sharp expansion when the composite material is heated and the crystalline polymer is melted.

As a result, the conductive particles forming conductive paths in the polymer are separated from each other, the conductive paths are cut, and the electrical resistance of the composite material increases sharply and the composite material shows PTC property.

When an organic substance such as the above polymer or the like is used as a matrix in a composite PTC material, however, there has been a problem in that when high temperatures caused by fault current continue for a long time, the composite material is unable to exhibit its intended action because the organic substance is generally low in heat resistance.

Study was also made on composite materials made of a silica type substance (a matrix) such as quartz, cristobalite or the like and conductive particles. Similarly to the barium titanate type ceramic, these materials are high in room temperature resistivity and give a large power loss.

Conventional composite materials also had a problem in that they allow no repeated operation because the resistance after operation does not return to the initial resistance even if a temperature falls once the resistance rises.

SUMMARY OF THE INVENTION

In view of the above-mentioned problems of the prior art, the present invention has been completed to provide a composite PTC material which has heat resistance, is low in power loss, and enables repeated operation.

According to the present invention, there is provided a composite PTC material made of cristobalite as a matrix and a conductive filler, having a room temperature resistivity of $10^{-1}$ Ωcm or less.

In the present composite PTC material, the conductive filler preferably has a room temperature resistivity of $10^{-3}$ Ωm or less when per se made into a sintered material and also preferably has particle diameters of 2–50 μm. The composite PTC material preferably has a relative density of 90% or more after firing.

In the present composite PTC material, the conductive filler is preferably at least one substance selected from the group consisting of single metals, metal silicides, metal carbides and metal borides; more preferably at least one substance selected from $MoSi_2$, $WSi_2$, Mo, W, Ni, and stainless alloys.

Preferably, the material is produced by firing at a temperature of more than 50° C. lower than a melting point of a filler material having the lowest melting point among filler materials composing the conductive filler in the present composite PTC material.

In the present composite PTC material, the conductive filler is contained preferably in a proportion of 20–35% by volume of the composite PTC material.

DETAILED DESCRIPTION OF THE INVENTION

Figure 1:
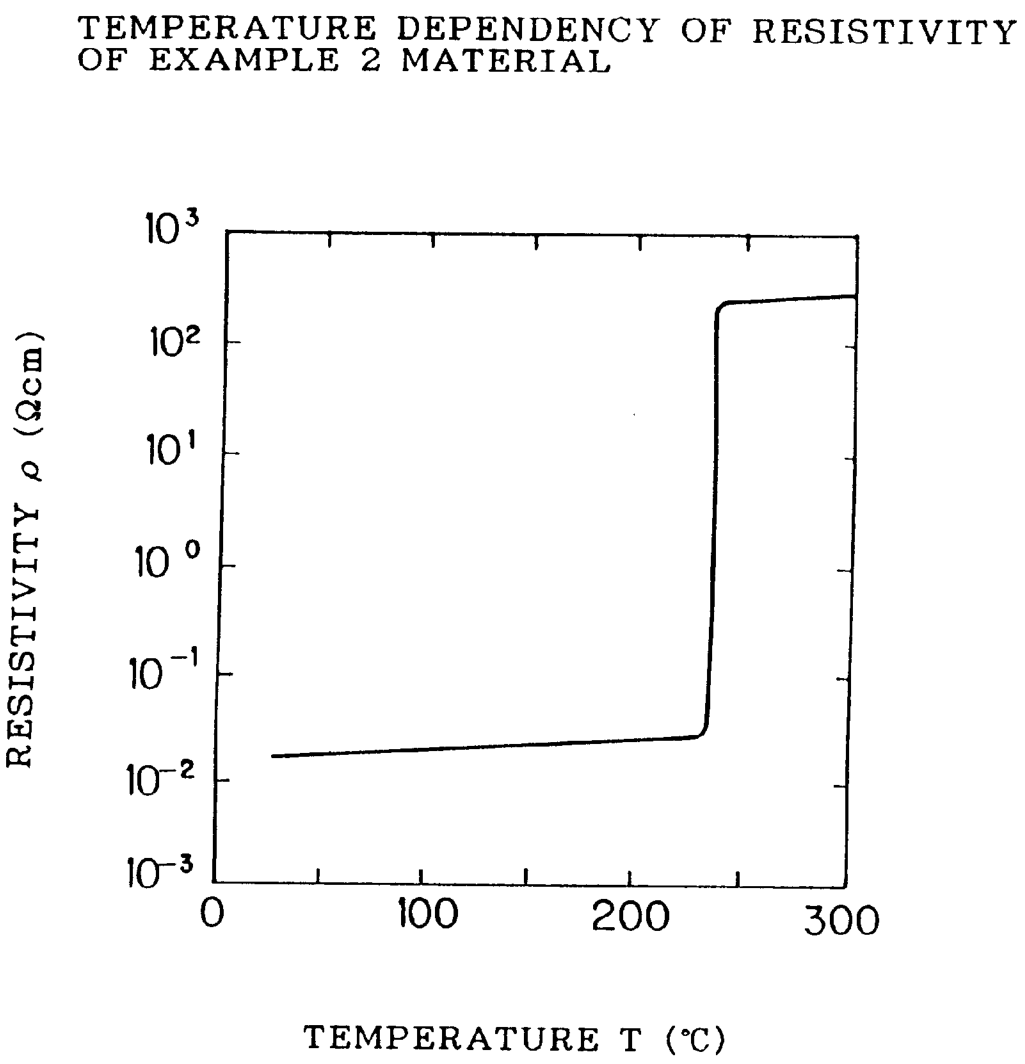
FIG. 1 is a graph showing the temperature dependency of electrical resistance, of the composite PTC material of Example 4 according to the present invention.

The present composite PTC material (hereinafter referred to as "the present PTC material") is made of cristobalite showing high thermal expansion and a conductive filler and has a room temperature resistivity of $10^{1}$ Ωcm or less.

The present PTC material has heat resistance, is low in power loss, and enables repeated operation.

PTC materials are required to show a big jump of resistance, i.e. a big difference in resistance between before (initial) and after operation.

The present PTC material assures a three-digit jump of resistance.

In the present PTC material, cristobalite is used as a matrix. Cristobalite is one of $SiO_2$ polymorphic minerals, like quartz and tridymite, and shows sharp expansion as the crystal structure changes at 230° C. from an α (tetragonal) system to a β (cubic) system (therefore, is a material showing high thermal expansion).

Therefore, in the present PTC material wherein cristobalite (which is per se an insulator) is mixed with a given proportion of a conductive filler and thereby insulator-conductor transition has been allowed to take place, cristobalite causes thermal expansion with the rise in temperature, whereby the conductive paths formed in the material are cut and PTC property appears.

Moreover, cristobalite has a high melting point (1,730° C.), has excellent heat resistance as compared with polymeric matrixes (organic substances), undergoes no damage caused by melting or the like when exposed to high temperatures for a long period of time, and is therefore suitable as a matrix of PTC material.

Cristobalite is obtained by calcinating quartz at high temperatures. Cristobalite can also be obtained by calcinating quartz at low temperatures in the presence of an alkali metal or alkaline earth metal which stabilizes cristobalite.

In the present invention, it is possible that quartz is used as a starting material for matrix and is converted into cristobalite in, for example, a firing step after molding.

The conductive filler is an additive for imparting conductivity to cristobalite which is an insulator. In the present invention, there can be used, as the conductive filler, at least one substance selected from the group consisting of metals such as Ni and stainless steels, metal silicides, metal carbides and metal borides. However, it is preferable to use at least one substance selected from particles of metals such as molybdenum, tungsten and the like, and metal silicides such as molybdenum silicide, tungsten silicide and the like, each having a high melting point.

In the present invention, the room temperature resistivity of the conductive filler is specified to be $10^{-3}$ Ωcm or less, whereby the room temperature resistivity of the present PTC material is reduced to $10^{1}$ Ωcm or less and the power loss of the PTC material is suppressed. Therefore, carbon which has a room temperature resistivity of $10^{-3}$ Ωcm or more and a low conductivity, is unable to suppress power loss and is unsuitable for use as a conductive filler for the present PTC material.

In the present invention, the particle diameters of the conductive filler are preferably 2 μm or more. In general, a big jump of resistance before and after operation can be obtained by decreasing the amount of the filler (conductor) relative to the amount of cristobalite (insulator). This decrease, however, results in increased room temperature resistivity and increased power loss.

In the present invention, the particle diameters of the conductive filler are controlled to 2 μm or more, whereby the conductive filler is allowed to have a surface area sufficient for mutual contact between individual particles and it becomes possible to lower a contact resistance and to achieve an intended jump of resistance while the increase in room temperature resistivity is being prevented.

The particle diameters of the conductive filler are also preferably 50 μm or less. It is because particle diameters of more than 50 μm makes difficult the uniform dispersion of the filler in the matrix.

Too small an amount of the filler used forms no conductive paths and gives an increased room temperature resistivity. Too large an amount of the filler gives no rise to cutting of conductive paths at high temperatures and causes no jump of resistance.

A suitable amount of the filler to be added depends on diameters of matrix particles and filler particles. The amount of the filler used is preferably 20–35% by volume of the whole volume of the present PTC material when the particle diameters of the matrix are in the range of 0.1 to 10 μm and the particle diameters of the filler are in the range of 2 to 50 μm.

In the present invention, the material is preferably produced by firing at a temperature of more than 50° C. lower than a melting point of a filler material having the lowest melting point among filler materials composing the conductive filler so as to prevent the filler from melting during firing.

This is because the filler is eluted outside the sintered body if the filler melts upon firing, which makes control of a ratio of a filler to be added difficult. Further, since when fillers are mutually deposited in the sintered body, the conductive paths cannot be cut and no jump of resistance is caused even if the cristobalite is thermally expanded.

The influence of a firing temperature was confirmed by the use of Ni simple substance (Melting point: 1450° C.) as a conductive filler. As a result, as shown in Table 1, a sintered body fired at 1350° C. or 1375° C. exhibited a jump of resistance, whereas a sintered body fired at 1450° C. and 1400° C. exhibited no jump of resistance, and elution of Ni was found by an external observation.

TABLE 1

| Raw materials Conductive filler Kind | Step conditions Firing temperature (° C.) | Properties of PTC material: External appearance after firing (Ni Elution) | Properties of PTC material: Jump of resistance (times) |
|---|---|---|---|
| Ni | 1350 | Nothing | 2000 |
| Ni | 1375 | Nothing | 2000 |
| Ni | 1400 | Observed | No jump |
| Ni | 1450 | Observed | No jump |

Therefore, when the conductive filler is composed of a single filler material, it is fired at a temperature of more than 50° C. lower than a melting point of the filler material as long as firing is possible.

Incidentally, when the conductive filler is composed of a plurality of filler materials, a firing temperature is determined on the basis of a melting point of a filler material having the lowest melting point.

The present PTC material is allowed to have, after sintering, a relative density of preferably 90% or more, more preferably 95% or more.

When the relative density is less than 90%, repeated operation becomes impossible because the resulting PTC material shows no return to initial resistance though it causes an intended jump of resistance even if a temperature is lowered.

The relative density of PTC material after sintering is not only affected by the particle diameters of the raw materials used but also low when a low firing temperature is used.

Then, description is made on an example of the process for producing the present PTC material.

Figure 2:
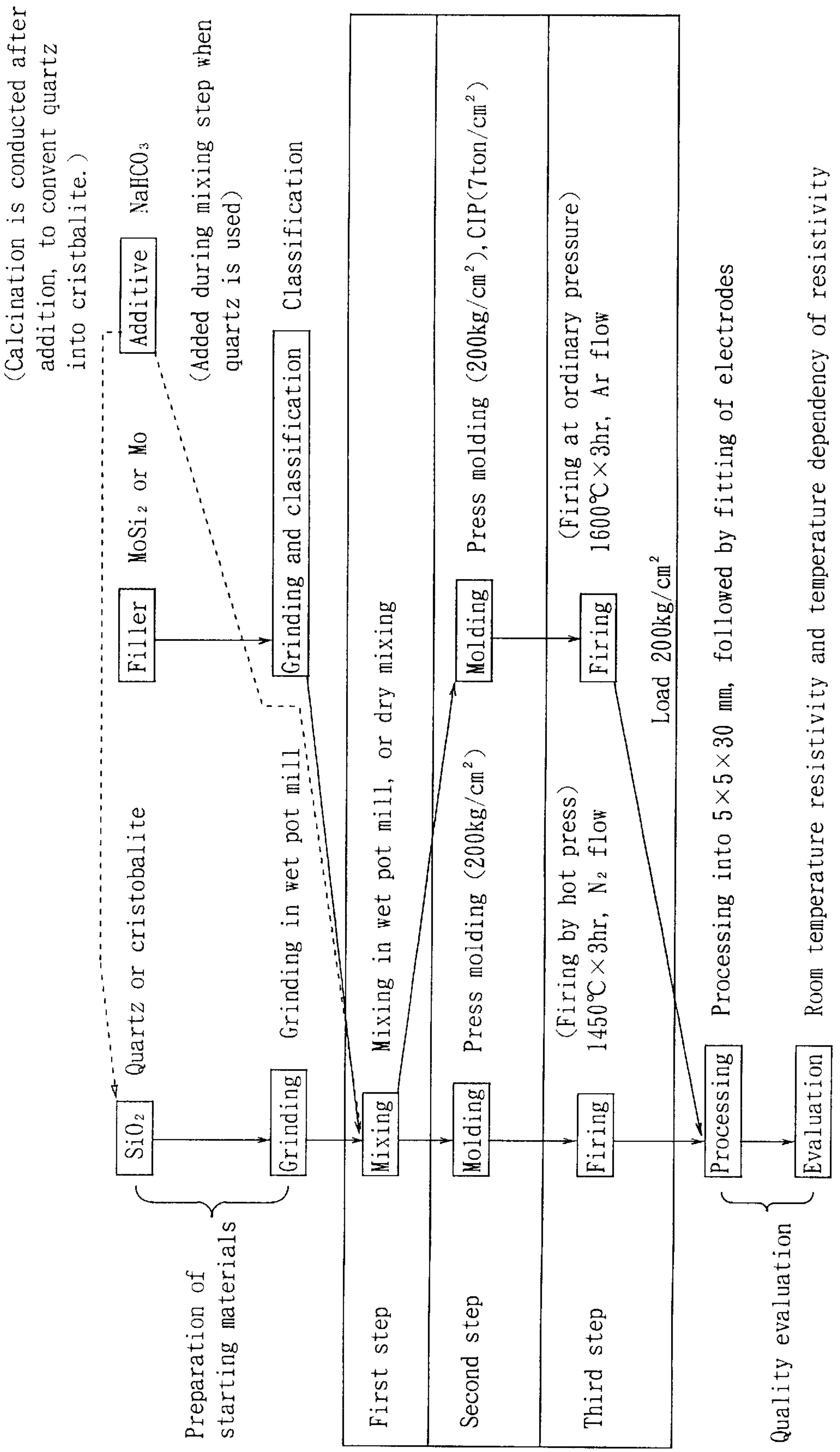
FIG. 2 is a flow chart showing an example of the process for producing the composite PTC material of the present invention.

The process for producing the present PTC material comprises three steps as shown in FIG. 2. The starting materials used in the process are prepared as follows.

When cristobalite is used as the starting material for the matrix, a quartz powder is calcinated at high temperatures, or quartz is calcinated in the presence of an alkali metal or an alkaline earth metal, to convert the quartz powder or quartz into cristobalite; and the resulting cristobalite is ground in a wet pot mill to obtain a cristobalite powder having an average particle diameter of 1 μm or less.

When quartz is used as the starting material for the matrix, quartz is ground in a wet pot mill to obtain a quartz powder having an average particle diameter of 0.5–2 μm.

As the starting material for the conductive filler, a metal silicide or metal particles are used. They are ground and then classified to obtain a conductive filler powder having desired particle diameters.

The first step for producing the present PTC material is a mixing step wherein the starting material for the matrix and the starting material for the conductive filler are mixed. The starting material for the matrix and the starting material for the conductive filler are weighed at desired proportions and mixed in a wet or dry ball mill to obtain a mixture.

When quartz is used as the starting material for the conductive filler, quartz must be converted into cristobalite in this step. Therefore, an alkali metal or an alkaline earth metal may be added as a stabilizer for cristobalite, during mixing of the two starting materials.

The second step is a molding step wherein the mixture obtained in the first step is subjected to press molding to obtain a molded material. When ordinary-pressure firing is conducted in the third step, the molded material may further be subjected to isotropic pressure molding.

The third step is a sintering step wherein the molded material is sintered. In this step, the molded material obtained in the second step is subjected to hot pressing by keeping the molded material at high temperatures in a nitrogen current with a given pressure being applied, whereby a sintered material is obtained.

The molded material obtained after isotropic pressure molding is subjected to ordinary-pressure firing by keeping the molded material at high temperatures in an argon current, whereby a sintered material is obtained.

The present invention is specifically described below by way of Examples. However, the present invention is not restricted to these Examples.

EXAMPLE 1

To a cristobalite powder having an average particle diameter of 0.8 μm was added a molybdenum silicide powder having an average particle diameter of 6.5 μm so that the amount of the latter powder became 25% by volume of the total of the two powders. Mixing was conducted in a wet ball mill.

The resulting mixture was subjected to press molding at a pressure of 200 kg/cm$^2$. The resulting molded material was subjected to hot pressing by keeping the molded material at 1,450° C. for 3 hours in a nitrogen current with a pressure of 200 kg/cm$^2$ being applied, whereby a sintered material was obtained.

The sintered material was processed into a quadrangular prism of 5×5×30 mm and measured for room temperature resistivity and temperature dependency of resistivity by the DC four-probe method. The results are shown in Table 1.

EXAMPLE 2

To a cristobalite powder having an average particle diameter of 0.8 μm was added a molybdenum silicide powder having an average particle diameter of 10 μm so that the amount of the latter powder became 26% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

EXAMPLE 3

To a cristobalite powder having an average particle diameter of 0.8 μm was added a molybdenum silicide powder having an average particle diameter of 19 μm so that the amount of the latter powder became 24% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

EXAMPLE 4

To a cristobalite powder having an average particle diameter of 0.8 μm was added a molybdenum silicide powder having an average particle diameter of 35 μm so that the amount of the latter powder became 25% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2 and FIG. 1.

EXAMPLE 5

To a cristobalite powder having an average particle diameter of 0.8 μm was added a tungsten powder having an average particle diameter of 10 μm so that the amount of the latter powder became 27% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

EXAMPLE 6

To a cristobalite powder having an average particle diameter of 0.8 μm was added a nickel powder having an average particle diameter of 30 μm so that the amount of the latter powder became 30% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

EXAMPLE 7

To a cristobalite powder having an average particle diameter of 0.8 μm was added a SUS 316 powder having an average particle diameter of 10 μm so that the amount of the latter powder became 30% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

EXAMPLE 8

To a quartz powder having an average particle diameter of 1.6 μm was added a molybdenum silicide powder having an average particle diameter of 6.5 μm so that the amount of the latter powder became 25% by volume of the total of the two powders. Thereto was added 1 mole %, based on the quartz powder, of sodium hydrogencarbonate. Mixing was conducted in a dry ball mill. The resulting mixture was subjected to the same press molding and hot pressing as in Example 1. The resulting sintered material was measured for room temperature resistivity and temperature dependency of resistivity. The results are shown in Table 2.

EXAMPLE 9

To a quartz powder having an average particle diameter of 1.2 μm was added a metallic molybdenum powder having an average particle diameter of 3.1 μm so that the amount of the latter powder became 25% by volume of the total of the two powders. Thereto was added 1 mole %, based on the quartz powder, of sodium hydrogencarbonate. Mixing was conducted in a dry ball mill.

The resulting mixture was subjected to press molding at a pressure of 200 $kg/cm^2$ and then to isotropic pressure molding at a pressure of 7 $t/cm^2$. The resulting molded material was subjected to ordinary-pressure firing by keeping the molded material at 1,600° C. for 3 hours in an argon current. The resulting sintered material was measured for room temperature resistivity and temperature dependency of resistivity. The results are shown in Table 2.

COMPARATIVE EXAMPLE 1

To a cristobalite powder having an average particle diameter of 0.8 μm was added a molybdenum silicide powder having an average particle diameter of 1.0 μm so that the amount of the latter powder became 25% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

COMPARATIVE EXAMPLE 2

To a cristobalite powder having an average particle diameter of 0.8 μm was added a molybdenum silicide powder having an average particle diameter of 1.0 μm so that the amount of the latter powder became 35% by volume of the total of the two powders. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

COMPARATIVE EXAMPLE 3

To a quartz powder having an average particle diameter of 1.6 μm was added a molybdenum silicide powder having an average particle diameter of 6.5 μm so that the amount of the latter powder became 20% by volume of the total of the two powders. Thereto was added 1 mole %, based on the quartz powder, of sodium hydrogencarbonate. Mixing was conducted in a dry ball mill. The resulting mixture was subjected to the same press molding and hot pressing as in Example 1. The resulting sintered material was measured for room temperature resistivity and temperature dependency of resistivity. The results are shown in Table 2.

COMPARATIVE EXAMPLE 4

To a quartz powder having an average particle diameter of 1.6 μm was added a molybdenum silicide powder having an average particle diameter of 6.5 μm so that the amount of the latter powder became 35% by volume of the total of the two powders. Thereto was added 1 mole %, based on the quartz powder, of sodium hydrogencarbonate. Mixing was conducted in a dry ball mill. The resulting mixture was subjected to the same press molding and hot pressing as in Example 1. The resulting sintered material was measured for room temperature resistivity and temperature dependency of resistivity. The results are shown in Table 2.

COMPARATIVE EXAMPLE 5

To a quartz powder having an average particle diameter of 10 μm was added a molybdenum silicide powder having an average particle diameter of 80 μm so that the amount of the latter powder became 25% by volume of the total of the two powders. Thereto was added 1 mole %, based on the quartz powder, of sodium hydrogencarbonate. Mixing was conducted in a wet ball mill. The resulting mixture was subjected to the same press molding and hot pressing as in Example 1. The resulting sintered material was measured for room temperature resistivity and temperature dependency of resistivity. The results are shown in Table 2.

COMPARATIVE EXAMPLE 6

To a quartz powder having an average particle diameter of 1.2 μm was added a metallic molybdenum powder having an average particle diameter of 3.1 μm so that the amount of the latter powder became 25% by volume of the total of the two powders. Thereto was added 1 mole %, based on the quartz powder, of sodium hydrogencarbonate. Mixing was conducted in a dry ball mill.

The resulting mixture was subjected to press molding at a pressure of 200 $kg/cm^2$ and then to isotropic pressure molding at a pressure of 7 $t/cm^2$. The resulting molded material was subjected to ordinary-pressure firing by keeping the molded material at 1,400° C. for 3 hours in an argon current. The resulting sintered material was measured for room temperature resistivity and temperature dependency of resistivity. The results are shown in Table 2.

TABLE 2

| | Raw materials | | | | | | | | | | | | |
|---|---|---|---|---|---|---|---|---|---|---|---|---|---|
| | Matrix | | Conductive filler | | | Step conditions | | | Properties of PTC material | | | | |
| | Kind | Particle diameters (μm) | Kind | Particle diameters (μm) | Content (Vol %) | Mixing conditions | Firing condition | Firing temperature (° C.) | Room temperature resistivity (Ω cm) | Jump of resistance (times) | Relative density (%) | Return of resistance |
| Example 1 | Cr | 0.8 | $MoSi_2$ | 6.5 | 25 | Wet | HP | 1450 | $1.0 \times 10^{-1}$ | 1000 | 95 | Possible |
| 2 | Cr | 0.8 | $MoSi_2$ | 10 | 26 | Wet | HP | 1450 | $4.0 \times 10^{-2}$ | 50000 | 95 | Possible |
| 3 | Cr | 0.8 | $MoSi_2$ | 19 | 24 | Wet | HP | 1450 | $9.0 \times 10^{-2}$ | 30000 | 96 | Possible |
| 4 | Cr | 0.8 | $MoSi_2$ | 35 | 25 | Wet | HP | 1450 | $1.7 \times 10^{-2}$ | 20000 | 96 | Possible |
| 5 | Cr | 0.8 | W | 10 | 27 | Wet | HP | 1450 | $2.0 \times 10^{-2}$ | 1000 | 95 | Possible |
| 6 | Cr | 0.8 | Ni | 30 | 30 | Wet | HP | 1350 | $1.0 \times 10^{-2}$ | 2000 | 96 | Possible |
| 7 | Cr | 0.8 | SUS | 10 | 30 | Wet | HP | 1350 | $4.0 \times 10^{-2}$ | 1000 | 95 | Possible |
| 8 | Quartz | 1.6 | $MoSi_2$ | 6.5 | 25 | Dry | HP | 1450 | $1.0 \times 10^{-1}$ | 2000 | 98 | Possible |

TABLE 2-continued

| | Raw materials | | | | | Step conditions | | | Properties of PTC material | | | |
|---|---|---|---|---|---|---|---|---|---|---|---|---|
| | Matrix | | Conductive filler | | | | | | | | | |
| | Kind | Particle dia-meters (μm) | Kind | Particle dia-meters (μm) | Content (Vol %) | Mixing condi-tions | Firing condition | Firing tempera-ture (° C.) | Room temperature resistivity (Ω cm) | Jump of resistance (times) | Relative density (%) | Return of resistance |
| 9 | Quartz | 1.2 | MO | 3.1 | 25 | Dry | Ordinary pressure | 1600 | $9.0 \times 10^{-2}$ | 5000 | 95 | Possible |
| Comparative Example 1 | Cr | 0.8 | $MoSi_2$ | 1.0 | 25 | Wet | HP | 1450 | $>10^6$ | No jump | 95 | — |
| Comparative Example 2 | Cr | 0.8 | $MoSi_2$ | 1.0 | 35 | Wet | RP | 1450 | $2.0 \times 10^{-3}$ | No jump | 96 | — |
| Comparative Example 3 | Quartz | 1.6 | $MoSi_2$ | 6.5 | 20 | Dry | HP | 1450 | $>10^6$ | No jump | 93 | — |
| Comparative Example 4 | Quartz | 1.6 | $MoSi_2$ | 6.5 | 35 | Dry | HP | 1450 | $2.5 \times 10^{-3}$ | No jump | 95 | — |
| Comparative Example 5 | Quartz | 10 | $MoSi_2$ | 80 | 25 | Wet | HP | 1450 | $1.2 \times 10^{-1}$ | 2000 | 85 | Impossible |
| Comparative Example 6 | Quartz | 1.2 | Mo | 3.1 | 25 | Dry | Ordinary pressure | 1400 | $3.0 \times 10^{-3}$ | 4000 | 71 | Impossible |

Cr is an abbreviation of cristobalite.
Particle diameters are shown as an average particle diameter.
HP is an abbreviation of hot press.

In each of the PTC materials of Examples 1–9 obtained by using a conductive filler having particle diameters of 2 μm or more, there were obtained a low resistivity and a high jump of resistance even though the PTC materials differed in the kinds of the starting materials used, the method of mixing the starting materials and the method of firing.

Meanwhile, in the PTC material of Comparative Example 1 obtained in the same manner as in Example 1 except that the particle diameters of conductive filler were as low as 1.0 μm, no conductive paths were formed and the room temperature resistivity was high; therefore, there occurred no jump of resistance. In the PTC material of Comparative Example 2 obtained in the same manner as in Example 1 except that the particle diameters of conductive filler were as low as 1.0 μm but the addition amount of conductive filler was increased, conductive paths were formed and the room temperature resistivity was low; however, the conductive paths could not be cut at high temperatures and there occurred no jump of resistance.

In the PTC material of Comparative Example 3 obtained in the same manner as in Example 8 except that the addition amount of conductive filler was too low (20%), no conductive paths were formed and the room temperature resistivity was high; therefore, there occurred no jump of resistance. In the PTC material of Comparative Example 4 obtained in the same manner as in Example 8 except that the addition amount of conductive filler was too high (35%), the conductive paths could not be cut at high temperatures and there occurred no jump of resistance.

In the PTC material of Comparative Example 5 having a relative density of less than 90%, there occurred a jump of resistance but there was no return to initial resistance even if a temperature is lowered. Thus, repeated operation cannot be conducted. Therefore, a relative density of 95% or more is preferred as seen in Examples 1–9.

Relative density of PTC material is affected by the particle sizes of the starting materials used, as seen in Comparative Example 5. Relative density is also low when a low firing temperature is employed, as seen in Comparative Example 6.

As described above, the composite PTC material of the present invention has reliable heat resistance required for current-limiting element because the present PTC material uses cristobalite as a matrix; moreover, the present PTC material, because it uses a filler having a high conductivity (e.g. metal silicide) and controlled particle diameters, gives a low room temperature resistivity and a high jump of resistance, both of which have been unobtainable with conventional PTC materials of $SiO_2$ type.

Further, repeated operation is possible with the present PTC material because it has a high relative density.

What is claimed is:

1. A composite PTC material having heat resistance and low power loss, capable of repeated operation and showing a three digit jump in resistance, said composite PTC material having a room temperature resistivity of $10^{-1}$ Ωcm or less and comprising a cristobalite matrix and a conductive filler, said conductive filler having a particle diameter of 2 to 50 μm and present in an amount of 20 to 35% by volume of the composite PTC material.

2. A composite PTC material according to claim 1, wherein the conductive filler, when per se made into a sintered material, has a room temperature resistivity of $10^{-3}$ Ωcm or less.

3. A composite PTC material according to claim 1, having a density relative to the true density of the material after firing of 90% or more.

4. A composite PTC material according to claim 1, wherein the conductive filler is at least one substance selected from the group consisting of single metals, metal silicides, metal carbides and metal borides.

5. A composite PTC material according to claim 1, wherein the conductive filler is at least one substance selected from $MoSi_2$, $WSi_2$, Mo, W, Ni, and stainless alloys.

6. A composite PTC material according to claim 1, wherein the material is produced by firing at a temperature of more than 50° C. lower than a melting point of a filler material having the lowest melting point among filler materials composing the conductive filler.

* * * * *